United States Patent
Tseng et al.

(10) Patent No.: US 11,587,623 B2
(45) Date of Patent: Feb. 21, 2023

(54) CONTENT-ADDRESSABLE MEMORY AND OPERATION METHOD THEREOF

(71) Applicant: MACRONIX INTERNATIONAL CO., LTD., Hsinchu (TW)

(72) Inventors: Po-Hao Tseng, Taichung (TW); Yu-Hsuan Lin, Taichung (TW); Feng-Min Lee, Hsinchu (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/320,336

(22) Filed: May 14, 2021

(65) Prior Publication Data
US 2022/0366988 A1    Nov. 17, 2022

(51) Int. Cl.
*G11C 16/26* (2006.01)
*G11C 16/04* (2006.01)
*G11C 5/06* (2006.01)
*G11C 15/04* (2006.01)
*G11C 16/30* (2006.01)

(52) U.S. Cl.
CPC ............... *G11C 16/26* (2013.01); *G11C 5/06* (2013.01); *G11C 15/04* (2013.01); *G11C 16/0441* (2013.01); *G11C 16/30* (2013.01)

(58) Field of Classification Search
CPC ........... G11C 16/26; G11C 5/06; G11C 15/04; G11C 16/0441; G11C 16/30
USPC ....................................... 365/185.01, 185.24
See application file for complete search history.

(56) References Cited

U.S. PATENT DOCUMENTS

| | | |
|---|---|---|
| 5,173,872 A | 12/1992 | Crawford et al. |
| 5,754,463 A | 5/1998 | Henstrom et al. |
| 5,812,467 A | 9/1998 | Pascucci |
| 5,977,993 A | 11/1999 | Matsuda |
| 6,072,723 A | 6/2000 | Guliani et al. |
| 6,249,449 B1 | 6/2001 | Yoneda et al. |
| 6,418,042 B1 | 7/2002 | Srinivasan et al. |
| 6,898,099 B1 | 5/2005 | Srinivasan et al. |
| 7,203,082 B1* | 4/2007 | Bhatia .............. G11C 15/04 365/204 |
| 7,920,398 B1* | 4/2011 | Khanna ............. G11C 15/04 365/49.1 |
| 8,625,320 B1* | 1/2014 | Argyres ............. G11C 15/04 365/49.1 |
| 9,349,738 B1* | 5/2016 | Nataraj ............. G11C 15/043 |
| 10,453,531 B1* | 10/2019 | Petti ................. G11C 5/025 |

(Continued)

FOREIGN PATENT DOCUMENTS

| | | |
|---|---|---|
| TW | I723878 B | 4/2021 |
| WO | 2014038341 A1 | 3/2014 |
| WO | 2019108402 A1 | 6/2019 |

*Primary Examiner* — Michael T Tran
(74) *Attorney, Agent, or Firm* — McClure, Qualey & Rodack, LLP

(57) ABSTRACT

A content-address memory (CAM) and an operation method are provided. The content-address memory comprises: a plurality of first signal lines; a plurality of second signal lines; and a plurality of CAM memory cells coupled to the first signal lines and the second signal lines, wherein in data match, a plurality of input signals are input into the CAM memory cells via the first signal lines; the input signals are compared with contents stored in the CAM memory cells; and a match result is determined based on an electrical characteristic of the second signal lines.

10 Claims, 17 Drawing Sheets

(56) References Cited

U.S. PATENT DOCUMENTS

| | | | |
|---|---|---|---|
| 10,896,731 B1* | 1/2021 | Li | G11C 15/046 |
| 10,998,047 B1* | 5/2021 | Li | G11C 15/00 |
| 11,081,595 B1 | 8/2021 | Sung et al. | |
| 2001/0045589 A1 | 11/2001 | Takeda et al. | |
| 2003/0161209 A1 | 8/2003 | Gillingham et al. | |
| 2011/0051486 A1* | 3/2011 | Chang | G11C 15/046 |
| | | | 365/210.1 |
| 2012/0206951 A1* | 8/2012 | Rachamadugu | G11C 15/04 |
| | | | 365/49.17 |
| 2017/0345500 A1* | 11/2017 | Tong | G11C 15/04 |
| 2018/0040374 A1* | 2/2018 | Zheng | G11C 15/046 |
| 2020/0110909 A1* | 4/2020 | Ge | G11C 11/1675 |
| 2020/0327942 A1* | 10/2020 | Akel | G11C 13/004 |
| 2021/0005263 A1 | 1/2021 | Castro | |
| 2021/0050060 A1* | 2/2021 | Li | G11C 11/4087 |
| 2021/0057022 A1* | 2/2021 | Jenkinson | G11C 11/40603 |
| 2021/0064455 A1* | 3/2021 | Akel | G11C 11/409 |
| 2021/0118505 A1* | 4/2021 | Chiang | G11C 15/00 |

* cited by examiner

CONTENT-ADDRESSABLE MEMORY AND OPERATION METHOD THEREOF

TECHNICAL FIELD

The disclosure relates in general to a memory and an operation method thereof, and more particularly to a content addressable memory and an operation method thereof.

BACKGROUND

Along with the development of the memory technology, a content-addressable memory (CAM) is invented. The CAM is a special type of computer memory used in certain very-high-speed searching applications. The CAM may compare an input search word against all rows of stored words in an array in a highly parallel manner. The CAM supplies a very powerful functionality for many applications, especially in pattern matching and search.

KD tree is a high-dimensional tree data structure. KD tree is used in nearest neighbor search in high-dimensional data space, such as nearest neighbor searching and matching of high-dimensional feature vectors in image retrieval and identification.

KD tree is a space-partitioning data structure. KD tree may be used in several applications, such as multi-dimensional search key or creating point clouds (LiDAR, Light Detection and Ranging). KD tree is a special case of binary space partitioning tree.

KD tree is a binary tree in which every leaf node is a k-dimensional point. Every non-leaf node may be thought of as implicitly generating a splitting hyperplane that divides the space into two parts. Points to the left of this hyperplane are represented by the left subtree of that node and points to the right of the hyperplane are represented by the right subtree.

FIG. 1 shows a Von Neumann KD tree. An example of searching X1=0.02 and X2=0.02 is described. First, it is determined whether the input signal X1 is higher than 0.51. In this example, the input signal X1 is not higher than 0.51. Then, it is determined whether the input signal X2 is higher than 0.4. In this example, the input signal X2 is not higher than 0.4. Then, it is determined whether the input signal X1 is higher than 0.1. In this example, the input signal X1 is not higher than 0.1. Thus, the search result is class A.

However, the conventional Von Neumann KD tree has a problem of long search time. Thus, how to design high efficiency search implementation by using CAM memory is one of main concerns.

SUMMARY

According to one embodiment of the application, a content-address memory (CAM) is provided. The content-address memory (CAM) comprises: a plurality of first signal lines; a plurality of second signal lines; and a plurality of CAM memory cells coupled to the first signal lines and the second signal lines, wherein in data match, a plurality of input signals are input into the CAM memory cells via the first signal lines; the input signals are compared with contents stored in the CAM memory cells; and a match result is determined based on an electrical characteristic of the second signal lines.

According to another embodiment, an operation method for a content-address memory (CAM) is provided. The method comprises: in data match, inputting a plurality of input signals into a plurality of CAM memory cells via a plurality of first signal lines; comparing the input signals with contents stored in the CAM memory cells; and determining a match result based on an electrical characteristic of a plurality of second signal lines.

BRIEF DESCRIPTION OF THE DRAWINGS

FIG. 10B and FIG. 100 shows tree search implemented by the CAM memory according to one embodiment of the application.

Figure 1:
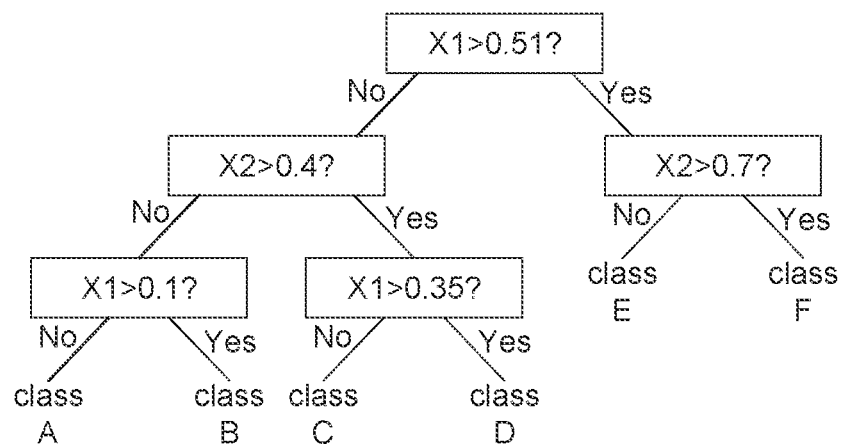
FIG. 1 shows a prior art Von Neumann KD tree.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

First Embodiment

Figure 2:
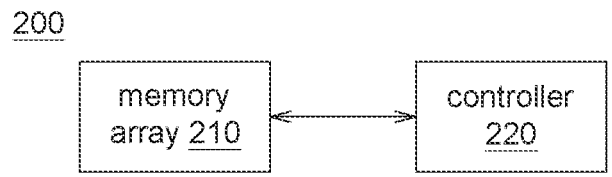
FIG. 2 shows a functional block diagram of a memory device according to one embodiment of the application.

FIG. 2 shows a functional block diagram of a memory device according to one embodiment of the application. The memory device 200 according to one embodiment of the application includes a memory array 210 and a controller 220. The memory array 210 is coupled to the controller 220.

The controller 220 controls the memory array 210 in data search operations, or data match operations. The memory array 210 is an analog content-addressable memory (CAM) array.

Figure 3:
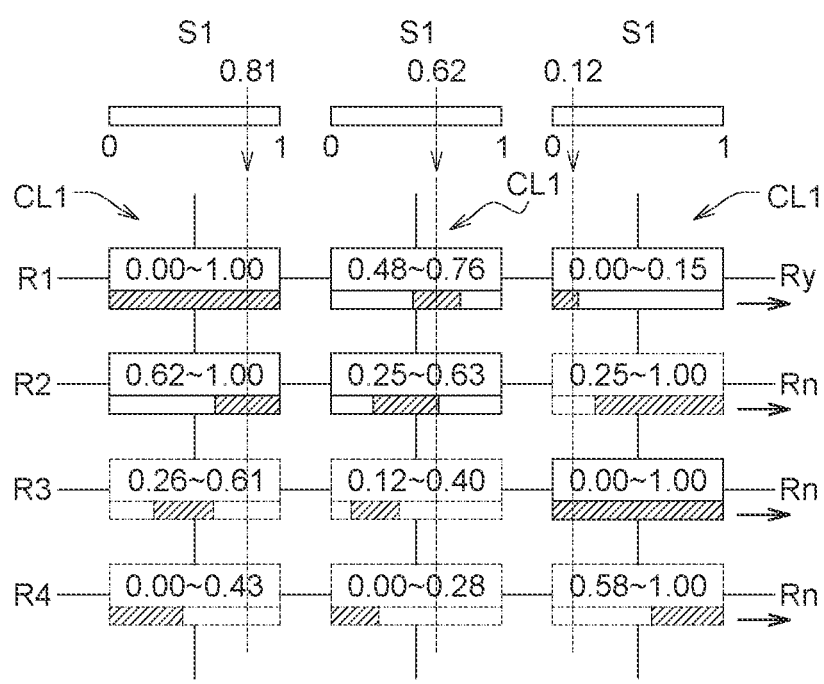
FIG. 3 shows operations of an analog CAM memory according to one embodiment of the application.

FIG. 3 shows operations of an analog CAM memory 300 according to one embodiment of the application. The analog CAM memory 300 includes a plurality of CAM memory cells CL1. The CAM memory cells CL1 are arranged in rows R1, R2, R3 and R4, for storing a plurality of analog contents. For example, the contents stored in the row R1 are "0.00~1.00", "0.48~0.76" and "0.00~0.15". The contents stored in the row R2 are "0.62~1.00", "0.25~0.63" and "0.25~1.00". The contents stored in the row R3 are "0.26~0.61" "0.12~0.40" and "0.00~1.00". The contents stored in the row R4 are "0.00~0.43", "0.00~0.28" and "0.58~1.00". Several input signals S1 are input into the analog CAM memory 300. The first input signal S1 has a content of "0.81"; the second input signal S1 has a content of "0.62"; and the third input signal S1 has a content of "0.12".

The input signals S1 are compared with the contents stored in the row R1. The contents "0.00~1.00", "0.48~0.76" and "0.00~0.15" stored in the row R1 are referred as a match range. Because "0.81", "0.62" and "0.12" are within "0.00~1.00", "0.48~0.76" and "0.00~0.15", a match result Ry is outputted.

Similarly, the input signals S1 are compared with the contents stored in the row R2; and a mismatch result Rn is outputted. The input signals S1 are compared with the contents stored in the row R3; and a mis-match result Rn is outputted. The input signals S1 are compared with the contents stored in the row R4; and a mismatch result Rn is outputted. The analog CAM memory 300 stores analog contents; and the analog contents matched with the input signals S1 are searched and outputted.

Figure 4:
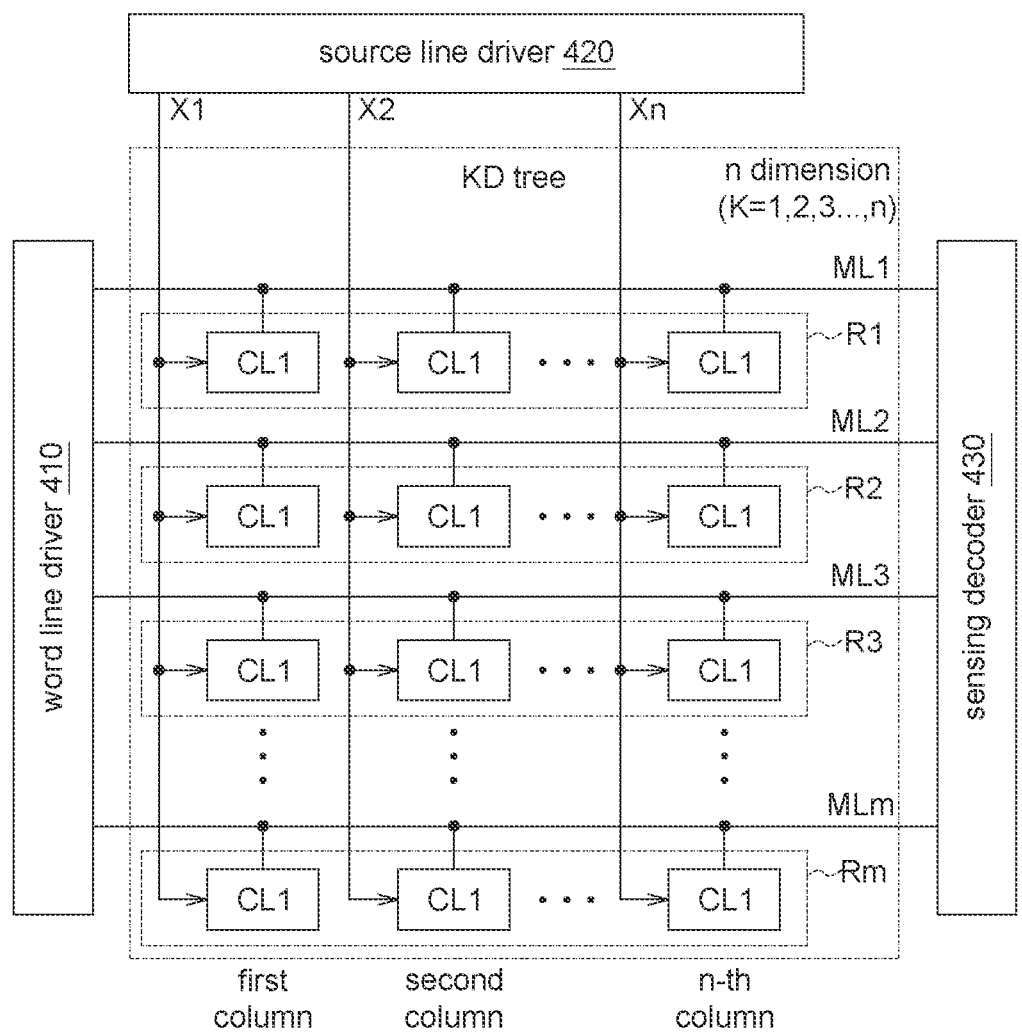
FIG. 4 shows an array structure of an analog CAM memory according to one embodiment of the application.

FIG. 4 shows an array structure of an analog CAM memory 400 according to one embodiment of the application. In the array structure, the analog CAM memory 400 further includes a word line driver 410 having a search register, a source line driver 420 and a sensing decoder 430. The word line driver 410 inputs the input signals X1~Xn to the analog CAM memory cells CD via a plurality of search lines (implemented by the source lines (the bit lines)). The match lines (implemented by the word lines) ML1, ML2, and MLm are coupled to the sensing decoder 430.

In FIG. 4, the analog CAM memory 400 may be used to implement KD search tree (n dimensions, K=1~n, n being a positive integer).

The analog CAM memory cells CL1 store contents as match ranges. The input signals X1~Xn are input into the analog CAM memory cells CL1, respectively.

Based on whether the input signals X1~Xn are matched with the contents stored in the first row R1, the voltage of the match line ML1 is pulled down or kept. Similarly, based on whether the input signals X1~Xn are matched with the contents stored in the second row R2, the voltage of the match line ML2 is pulled down or kept, and so on. The sensing decoder 430 may analyze which row has most matched contents as the input signals X1~Xn.

Thus, the analog CAM memory 400 may store analog contents and the analog contents matched with the input signals S1 are searched.

For understanding, an example in which the analog CAM memory 400 is used to implement two-layer KD search tree (two dimensions) is described, but the application is not limited by this.

Figure 5:
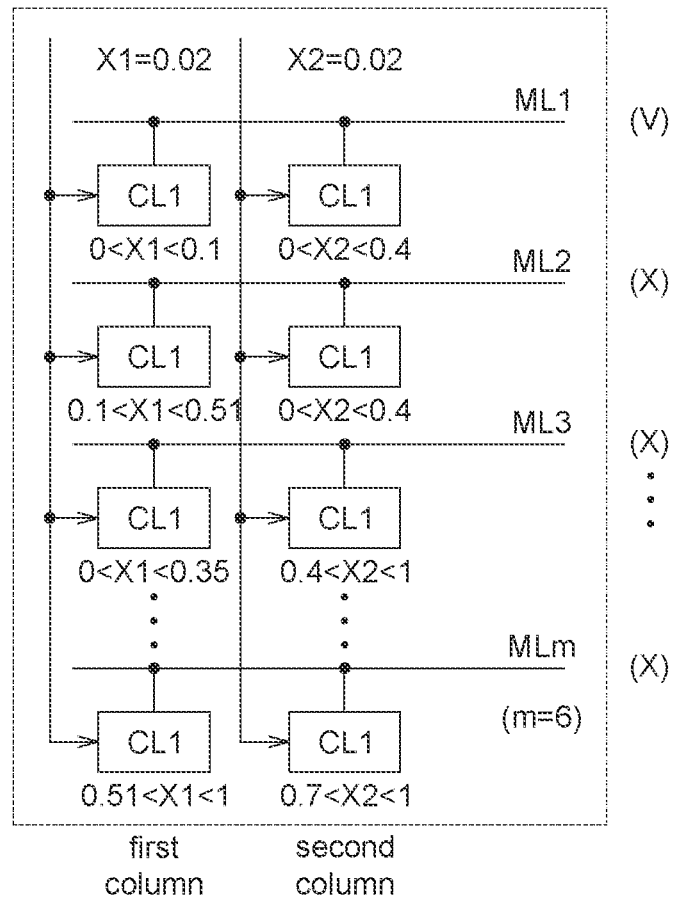
FIG. 5 shows an example in which the analog CAM memory is used to implement two-layer KD search tree (two dimensions)

FIG. 5 shows an example in which the analog CAM memory 400 is used to implement two-layer KD search tree (two dimensions).

The analog CAM memory cells CL1 store respective contents as the match ranges. The input signals X1-X2 are input into the analog CAM memory cells CL1, respectively.

In the following, the analog CAM memory cells CD in the first column store "0~0.1", "0.1~0.51", "0~0.35", "0.35~0.51", "0.51~1" and "0.51~1"; and the analog CAM memory cells CL1 in the second column store "0~0.4", "0~0.4", "0.4~1", "0.4~1", "0~0.7" and "0.7~1", which is not to limit the application.

In comparison, when the input signals X1 and X2 match the contents stored in the analog CAM memory cells CD of the same match line, the voltage of the corresponding match line is kept. On the contrary, when the input signals X1 and X2 do not match the contents stored in the analog CAM memory cells CL1 of the same match line, the voltage of the corresponding match line is pulled down.

The input signals X1 and X2 being equivalent to 0.02 and 0.02 are described.

As shown in FIG. 5, the input signal X1=0.02 and X2=0.02 are compared with the content stored the analog CAM memory cells CL1 on the same match line. As shown in FIG. 5, the input signal X1=0.02 and X2=0.02 are matched with the contents stored in the analog CAM memory cells CL1 of the match line MLA; and thus the voltage of the match line ML1 is kept. The input signal X1=0.02 and X2=0.02 are not matched with the contents stored in the analog CAM memory cells CL1 of the match line ML2; and thus the voltage of the match line ML2 is pulled down. Similarly, the voltages of the match lines ML3~MLm are pulled down.

Further, if there are more than one match lines matched, the sensing decoder 430 may analyze that which match line has most matched contents with the input signals X1~Xn and output the match result.

It is supposed that the match results of the match lines ML1~MLm are corresponding to class A to class F. As shown in FIG. 5, the match line ML1 is kept and other match lines are pulled down. Thus, the classification result of the KO search tree is class A.

In one embodiment of the application, as for the match lines ML1~MLm, the analog CAM memory cells are coupled in parallel.

In one embodiment of the application, in the analog CAM memory, the analog CAM memory cells CL1 are arranged in an array, wherein the analog CAM memory cells CL1 are coupled in parallel. Each match line is coupled to a plurality of analog CAM memory cells CL1. When the comparison results of the analog CAM memory cells CL1 on the same match line are all matched, the voltage of the match line is kept. On the contrary, when the comparison results of the analog CAM memory cells CL1 on the same match line are not all matched, the voltage of the match line is pulled down.

Figure 6A:
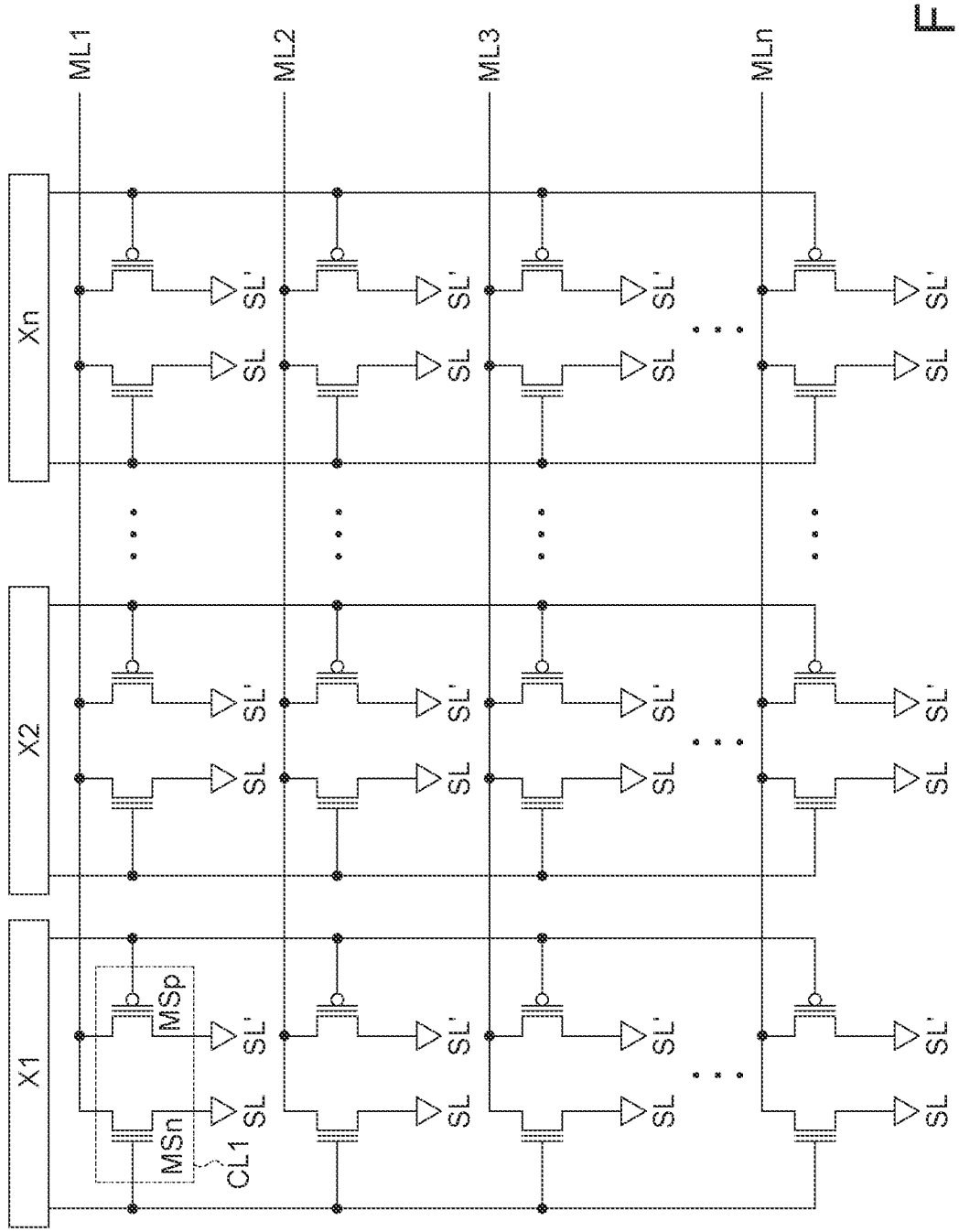
FIG. 6A shows a circuit structure of the analog CAM memory cell in one embodiment of the application.

FIG. 6A shows a circuit structure of the analog CAM memory cell CL1 in one embodiment of the application. The analog CAM memory cell CL1 includes a first floating-date device MSn and a second floating-gate device MSp. The first floating-gate device MSn has a N-type channel while the second floating-gate device MSp has a P-type channel. The first floating-gate device MSn and the second floating-gate device MSp are coupled in parallel.

The first floating-gate device MSn is a NMOS transistor while the second floating-gate device MSp is a PMOS transistor. Drain terminals of the first floating-gate device MSn and the second floating-gate device MSp are coupled to a match line. The source terminal of the first floating-gate device MSn is coupled to a source line SL while a source terminal of the second floating-gate device MSp is coupled a source line SL', wherein the source line SL and the source line SL' are complementary. The input signal is input into the gate terminals of the first floating-gate device MSn and the second floating-gate device MSp at the same time.

"The source line SL and the source line SL' are complementary" refer to that when one of the source line SL and the source line SL' is applied by a high level, the other one of the source line SL and the source line SL' is applied by a low level.

In the analog CAM memory cell CL1, the threshold voltage of the first floating-gate device MSn is higher than the threshold voltage of the second floating-gate device MSp, and thus a match range MR is formed between the threshold voltage of the first floating-gate device MSn and the threshold voltage of the second floating-gate device MSp. In the analog CAM memory cell CL1, the lower limit of the match range is set by the threshold voltage of the second floating-gate device MSp and the upper limit of the match range is set by the threshold voltage of the first floating-gate device MSn.

When the input signal is within the match range, the first floating-gate device MSn is turned off and the second floating-gate device MSp is turned off. Thus, the pass current (the sensing current) is not formed.

When the input signal is not within the match range, the first floating-gate device MSn is turned on or the second floating-gate device MSp is turned on. Thus, the pass current (the sensing current) is formed.

Figure 6B:
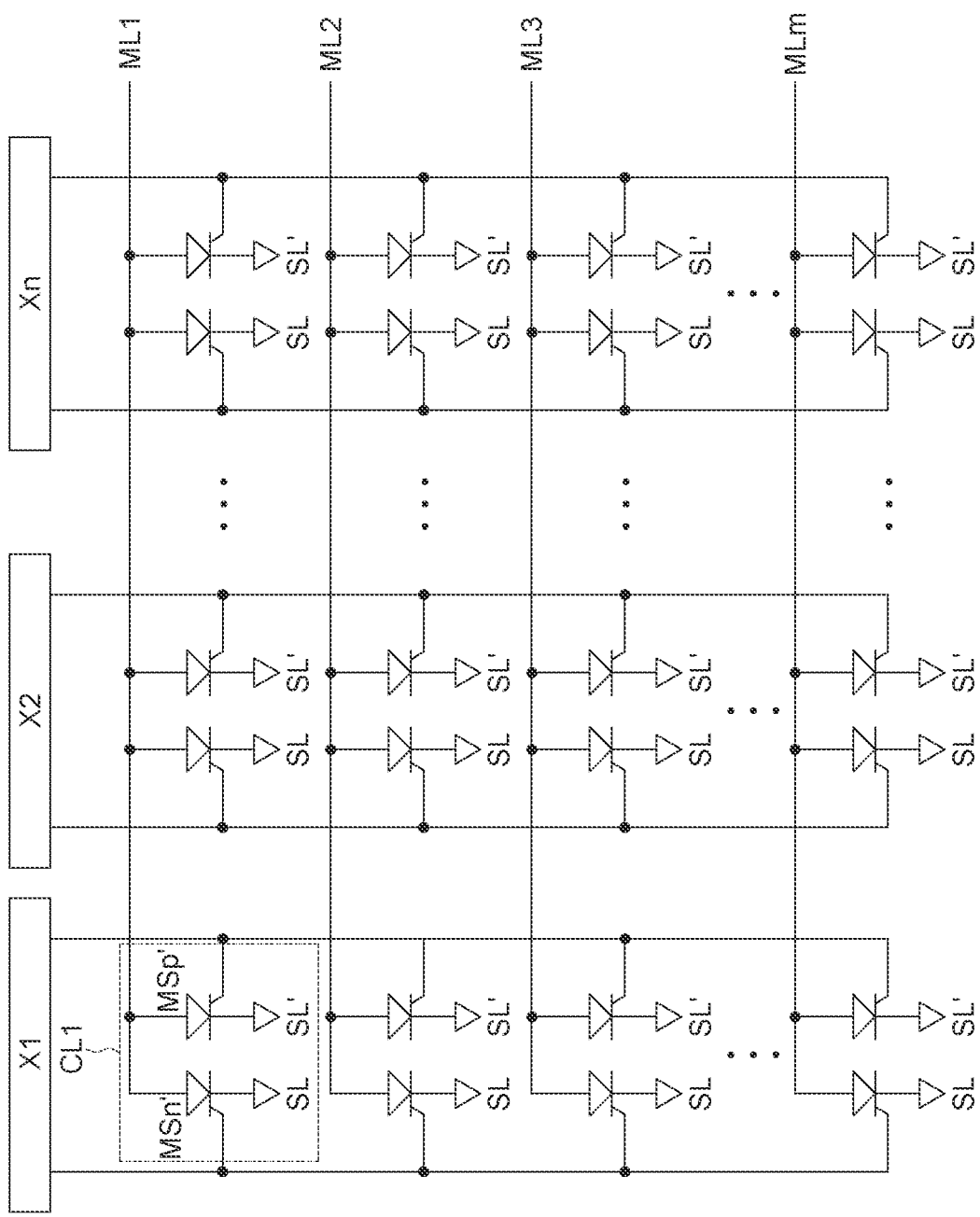
FIG. 6B shows another circuit structure of the analog CAM memory cell in one embodiment of the application.

FIG. 6B shows another circuit structure of the analog CAM memory cell CL1 in one embodiment of the application. The analog CAM memory cell CL1 includes a first super steep slope device MSn' and a second super steep slope device MSp'. The first super steep slope device MSn' has a N-type channel while the second super steep slope device MSp' has a P-type channel. The first super steep slope device MSn' and the second super steep slope device MSp' are coupled in parallel.

A first terminal (i.e. the anode) of the first super steep slope device MSn' and a first terminal of the second super steep slope device MSp' are coupled to a match line. A second terminal (i.e. the cathode) of the first super steep slope device MSn' and a second terminal of the second super steep slope device MSp' are coupled to a search line SL and a search line SL', respectively. The search line SL and the search line SL' are complementary. The input signal is input into a control terminal (the gate terminal) of the first super steep slope device MSn' and a control terminal of the second super steep slope device MSp' at the same time.

In the analog CAM memory cell CL1, the threshold voltage of the first super steep slope device MSn' is higher than the threshold voltage of the second super steep slope device MSp', and thus a match range MR is formed between the threshold voltage of the first super steep slope device MSn' and the threshold voltage of the second super steep slope device MSp'. In the analog CAM memory cell CL1, the lower limit of the match range is set by the threshold voltage of the second super steep slope device MSp' and the upper limit of the match range is set by the threshold voltage of the first super steep slope device MSn'.

When the input signal is within the match range, the first super steep slope device MSn' is turned off and the second super steep slope device MSp' is turned off. Thus, the pass current (the sensing current) is not formed.

When the input signal is not within the match range, the first super steep slope device MSn' is turned on or the second super steep slope device MSp' is turned on. Thus, the pass current (the sensing current) is formed.

In one embodiment of the application, the match range is set by programming the first floating-gate device MSn and the second floating-gate device MSp. First, the first floating-gate device MSn is programmed. In this step, the first floating-gate device MSn is programmed by Fowler-Nordheim tunneling (FN tunneling) or Channel Hot Electron programming (CHE programming). For example, the gate terminal of the first floating-gate device MSn is applied by a FN voltage while the gate terminal of the second floating-gate device MSp is applied by a pass voltage. After the first floating-gate device MSn is programmed, the upper limit of the match range is defined.

Similarly, the second floating-gate device MSp is programmed. In this step, the second floating-gate device MSp is programmed by FN tunneling or CHE programming. For example, the gate terminal of the first floating-gate device MSn is applied by a pass voltage while the gate terminal of the second floating-gate device MSp is applied by a FN voltage. After the second floating-gate device MSp is programmed, the lower limit of the match range is defined.

Figure 7:
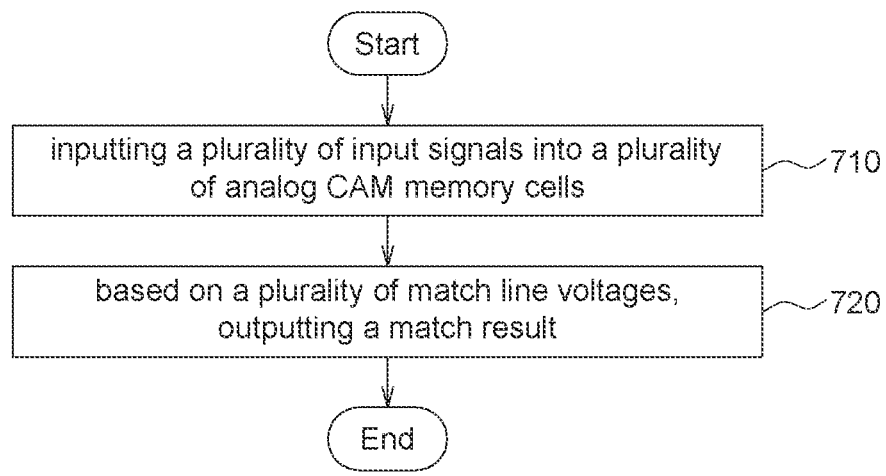
FIG. 7 shows an operation method for the analog CAM memory according to one embodiment of the application.

The operation of one embodiment of the application is shown in FIG. 7.

FIG. 7 shows an operation method for the analog CAM memory according to one embodiment of the application. In step 710, a plurality of input signals are input into the analog CAM memory cells CL1. In the analog CAM memory, the analog CAM memory cells CL1 are arranged in an array, wherein the analog CAM memory cells CL1 are coupled in parallel. A plurality of match lines are coupled to the analog CAM memory cells, respectively.

In step 720, based on a plurality of match line voltages, a match result is output. For example, when the comparison results of the analog CAM memory cells CL1 coupled the same match line are all matched, the match line voltage is kept. When the comparison results of the analog CAM memory cells CL1 coupled the same match line are not all matched, the match line voltage is changed (for example but not limited by, pulled down). Based on whether the match line voltage is changed or not, a match result is output. Further, if there are several match lines having matched results, the sensing decoder 430 may analyze which content of the match line is most matched to the input signals for outputting a match result.

Further, in one embodiment of the application, the match range of the analog CAM memory cell CL1 is adjustable. The lower limit of the match range is set by programming the second floating-gate device MSp or the second super steep slope device MSp'; and the upper limit of the match range is set by programming the first floating-gate device MSn or the first super steep slope device MSn'.

The first embodiment of the application may be applied in machine learning, for example but not limited by, decision tree, KD search tree, random forest, Support Vector Machine (SVM) and so on. The first embodiment of the application may be also applied in neutral network for searching classification. The first embodiment of the application may be also applied in database application for searching similar data.

The first embodiment of the application may have fast search speed and compare high data for improving data search speed and performance.

Second Embodiment

Figure 8A:
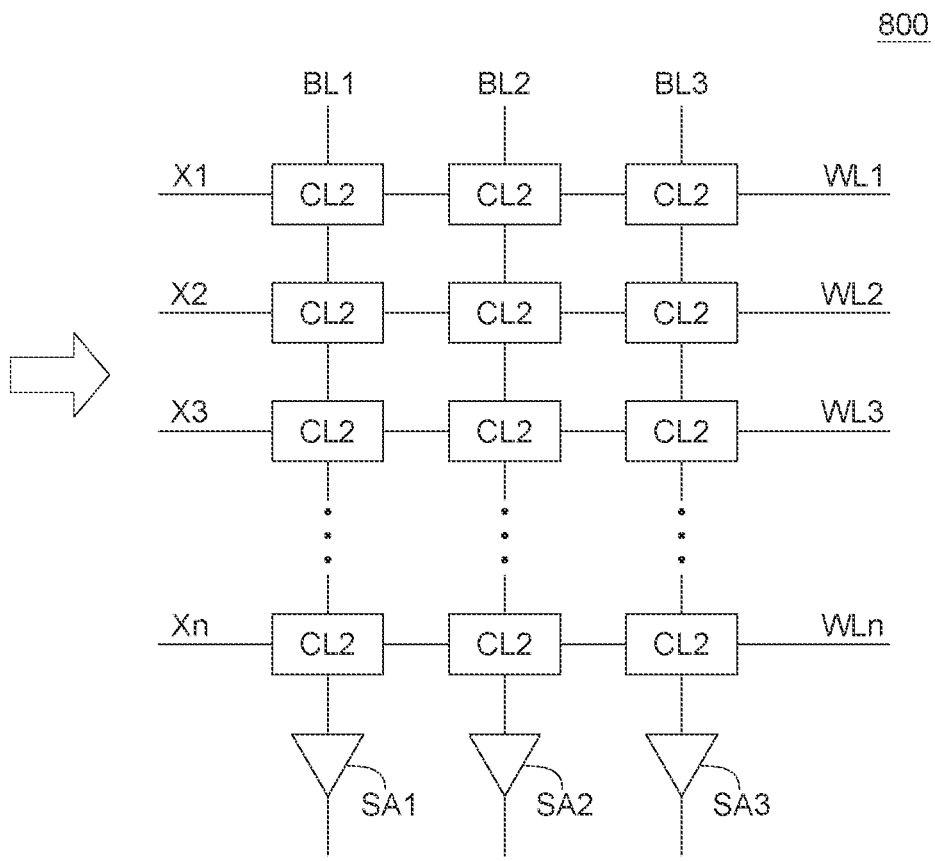
FIG. 8A shows a CAM memory according to a second embodiment of the application.
Figure 8B:
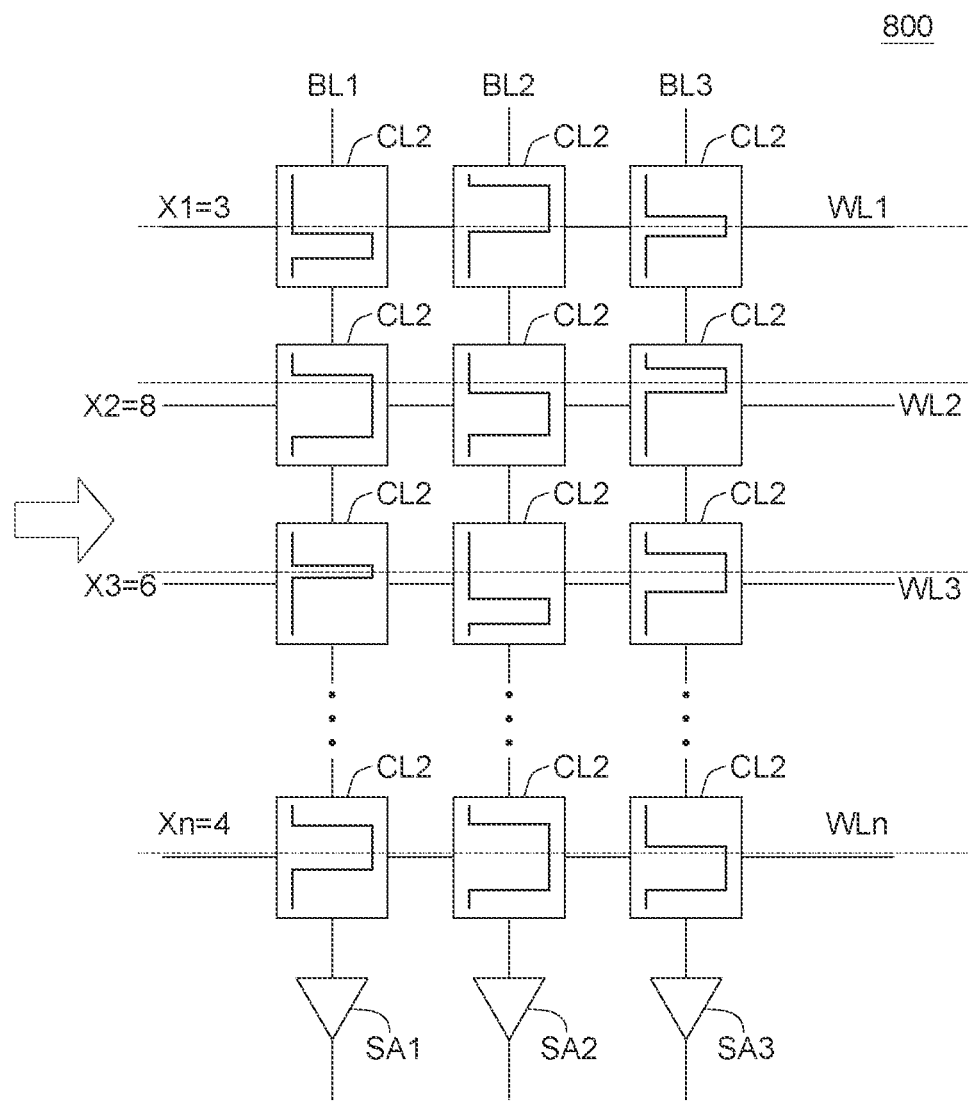
FIG. 8B shows operations of the CAM memory according to the second embodiment of the application.

FIG. 8A shows a CAM memory 800 according to a second embodiment of the application. FIG. 8B shows operations of the CAM memory 800 according to the second embodiment of the application.

As shown in FIG. 8A, the CAM memory 800 according to the second embodiment of the application includes a plurality of CAM memory cells CL2, a plurality of bit lines, a plurality of word lines, and a plurality of sensing amplifiers. The CAM memory cells CL2 are arranged in an array for storing contents (analog contents, digital contents or multi-level contents. In other words, the CAM memory cells CL2 may be analog CAM memory cells, digital CAM memory cells or multi-level CAM memory cells. As for the bit lines BL1~BL3, the CAM memory cells CL2 are coupled in series.

In searching, the input signals X1~Xn are input into the CAM memory cells CL2 via the search lines (i.e. the word lines WL1~WLn) for data searching and data comparison. When the input signal is matched with the content stored in the CAM memory cell CL2, the CAM memory cell CL2 outputs a sensing current and vice versa.

When contents stored in all CAM memory cells CL2 on the same bit line are matched with the input signals X1~Xn, a sensing current is generated on the bit line and sensed by the sensing amplifier. On the contrary, when at least one content stored in the CAM memory cells CL2 on the same bit line is not matched with the input signals X1~Xn, no sensing current is generated on the bit line.

Thus, in the second embodiment, the sensing amplifiers SA1~SA3 are used to sense whether the sensing current passes through the bit lines BL1~BL3 for determining whether data search is matched.

Refer to FIG. 8B. In FIG. 8B, the input signals X1~Xn are 3, 8, 6 and 4, and the contents stored in the CAM memory cells CL2 are multi-level contents, which is not to limit the application. The content stored in the first CAM memory cell CL2 on the bit line BL1 is not matched with the input signal X1, and thus, no sensing current is generated on the bit line BL1. Similarly, the content stored in the first CAM memory cell CL2 on the bit line BL2 is matched with the input signal X1, and thus, the first CAM memory cell CL2 on the bit line BL2 generates the sensing current. But the contents stored in the second and the third CAM memory cells CL2 on the bit line BL2 are not matched with the input signals X2 and X3, and thus, no sensing current is generated on the bit line BL2. Similarly, all CAM memory cells CL2 on the bit line BL3 are matched with the input signals X1~Xn, and thus a sensing current is generated on the bit line BL3.

Further, in order to prevent sensing error, when the sensing current sensed by the sensing amplifiers SA1~SA3 is higher than a reference sensing current, data search is determined to be matched.

Figure 9A:
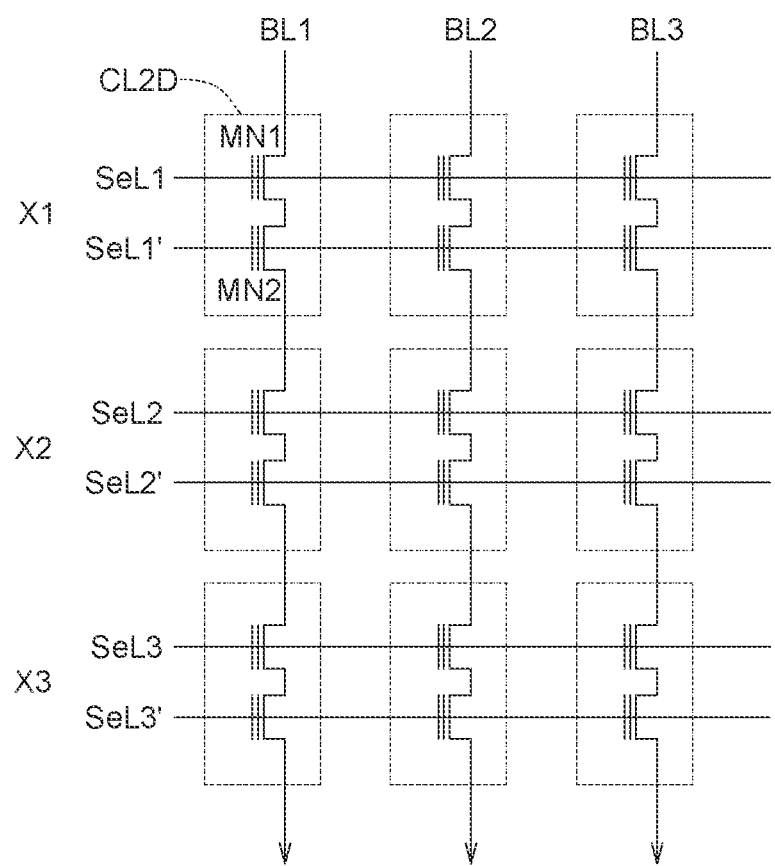
FIG. 9A to FIG. 9C show different examples of the CAM memory cell in one embodiment of the application.
Figure 9B:
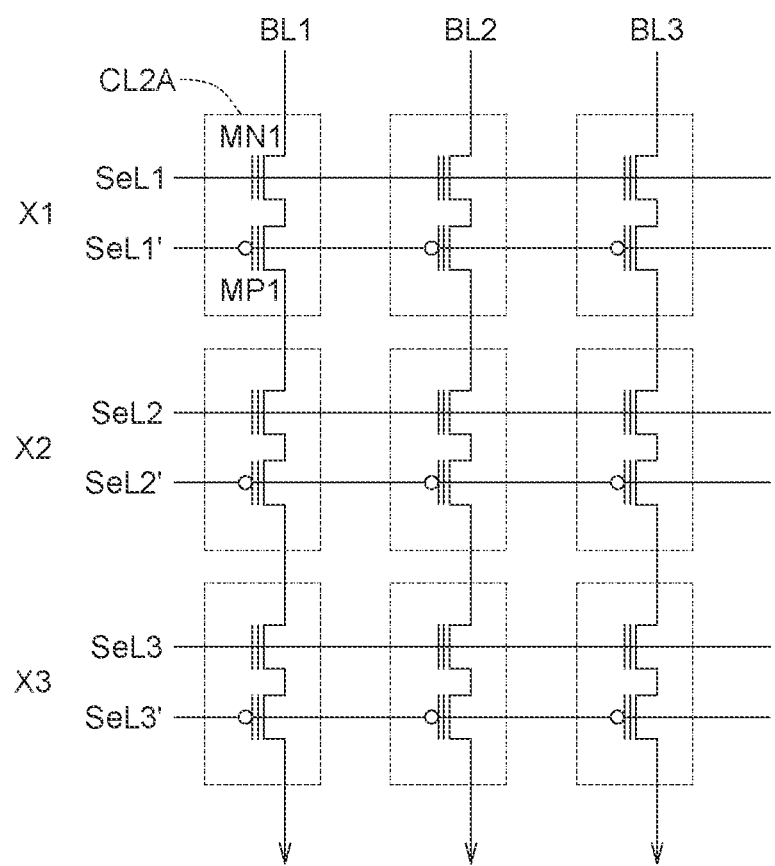
Figure 9C:
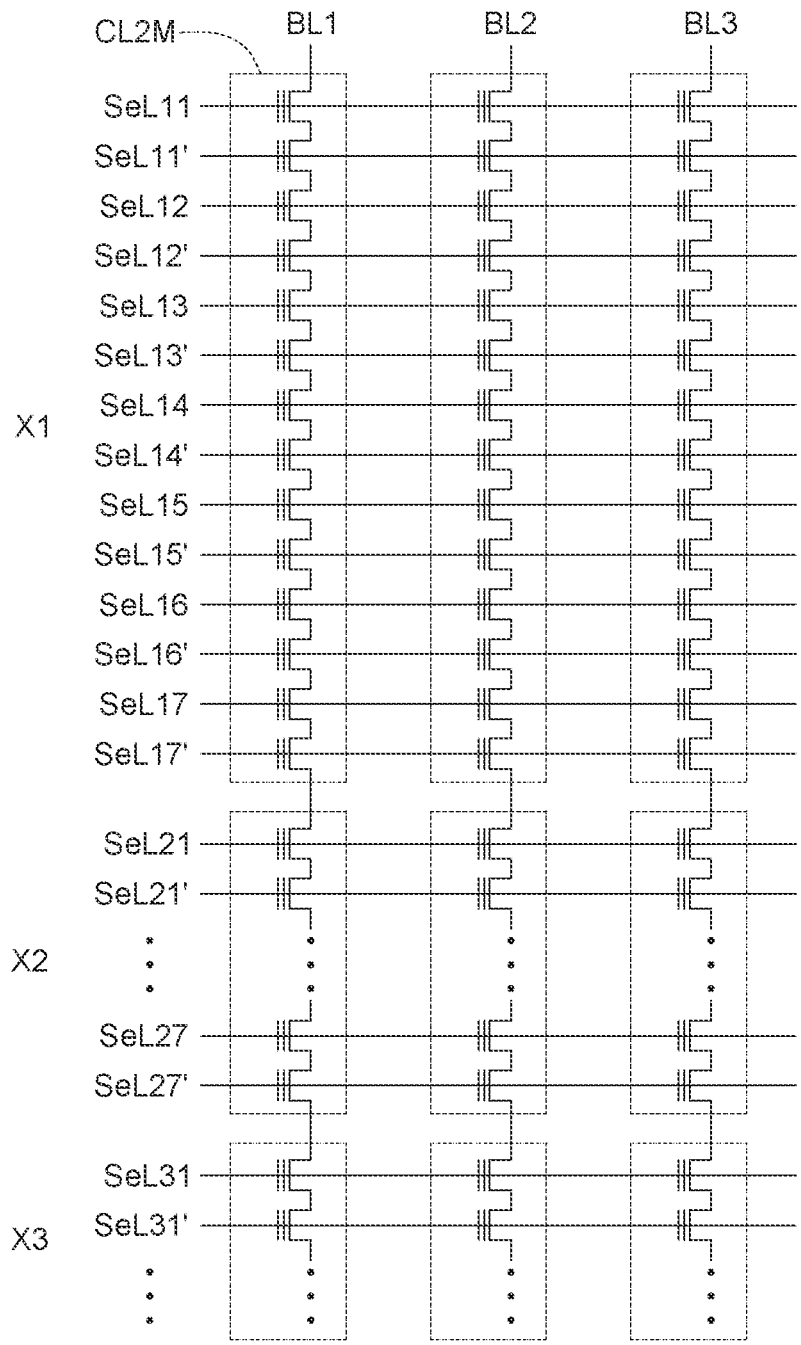

FIG. 9A to FIG. 9C show different examples of the CAM memory cell CL2 in one embodiment of the application. The digital CAM memory cell CL2D in FIG. 9A is for digital data matching (that is, the input signals X1~Xn are digital data (logic 1 or logic 0 or don't care (x)). The content stored in the digital CAM memory cell CL2D is a digital content (logic 1 or logic 0 or don't care (x)). The digital CAM memory cell CL2D includes two floating-gate NIMOS transistors MN1 and MN2 coupled in series. Gates of the floating-gate NMOS transistors MN1 and MN2 receive the input signals X1 via the search lines Sel1 and Sel1' and so on.

The analog CAM memory cell CL2A in FIG. 9B is for analog data matching (that is, the input signals X1~Xn are analog data). The content stored in the analog CAM memory cell CL2A is an analog content. The analog CAM memory cell CL2A includes a floating-gate NMOS transistor MN1 and a floating-gate PMOS transistor MP1 coupled in series.

The multi-level CAM memory cell CL2M in FIG. 9C is for multi-level data matching (that is, the input signals X1~Xn are multi-level data). The content stored in the multi-level CAM memory cell CL2M is a multi-level content. As shown in FIG. 9C, the multi-level content stored in the multi-level CAM memory cell CL2M may be ranged between 0~7, which is not to limit the application. The multi-level CAM memory cell CL2M includes several floating-gate NMOS transistors coupled in series. As shown in FIG. 9C, respective gates of the floating-gate NMOS transistors receive the input signals X1~Xn via the search lines Sel11, Sel11', ..., Sel17', Sel21, Sel21', ..., Sel27, Sel27', Sel31, Sel31'....

In other possible example of the second embodiment, the floating-gate PMOS/NMOS transistors in FIG. 9A to FIG. 9C may be replaced by the P/N type super steep slope devices.

Figure 10A:
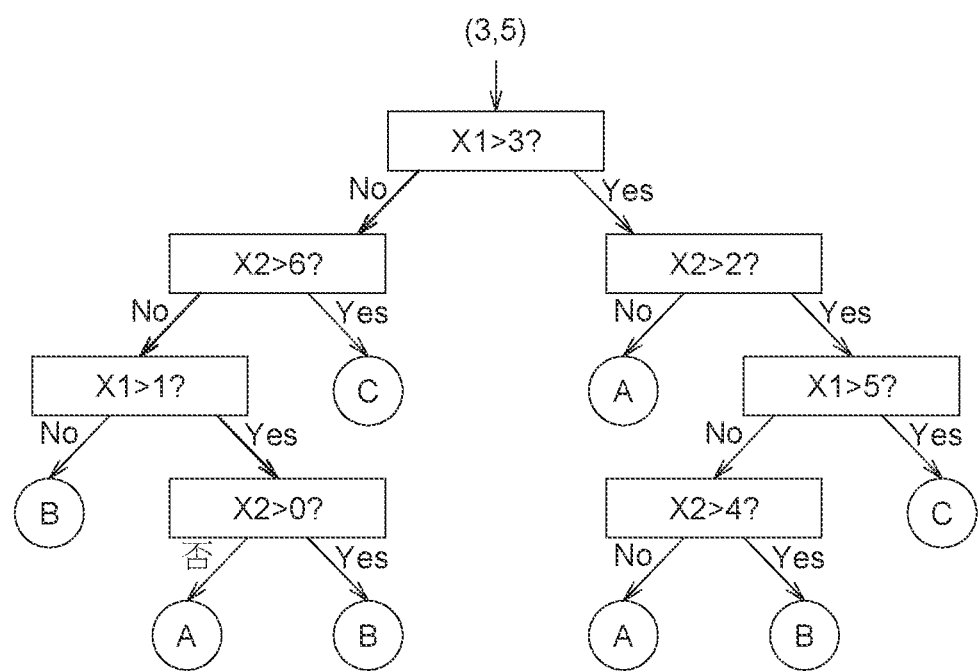
FIG. 10A shows Von Neumann search tree.

FIG. 10A shows Von Neumann search tree. Taking search of the input signals X1=3 and X2=5 as an example, the classification is B class after search.

Figure 10B:
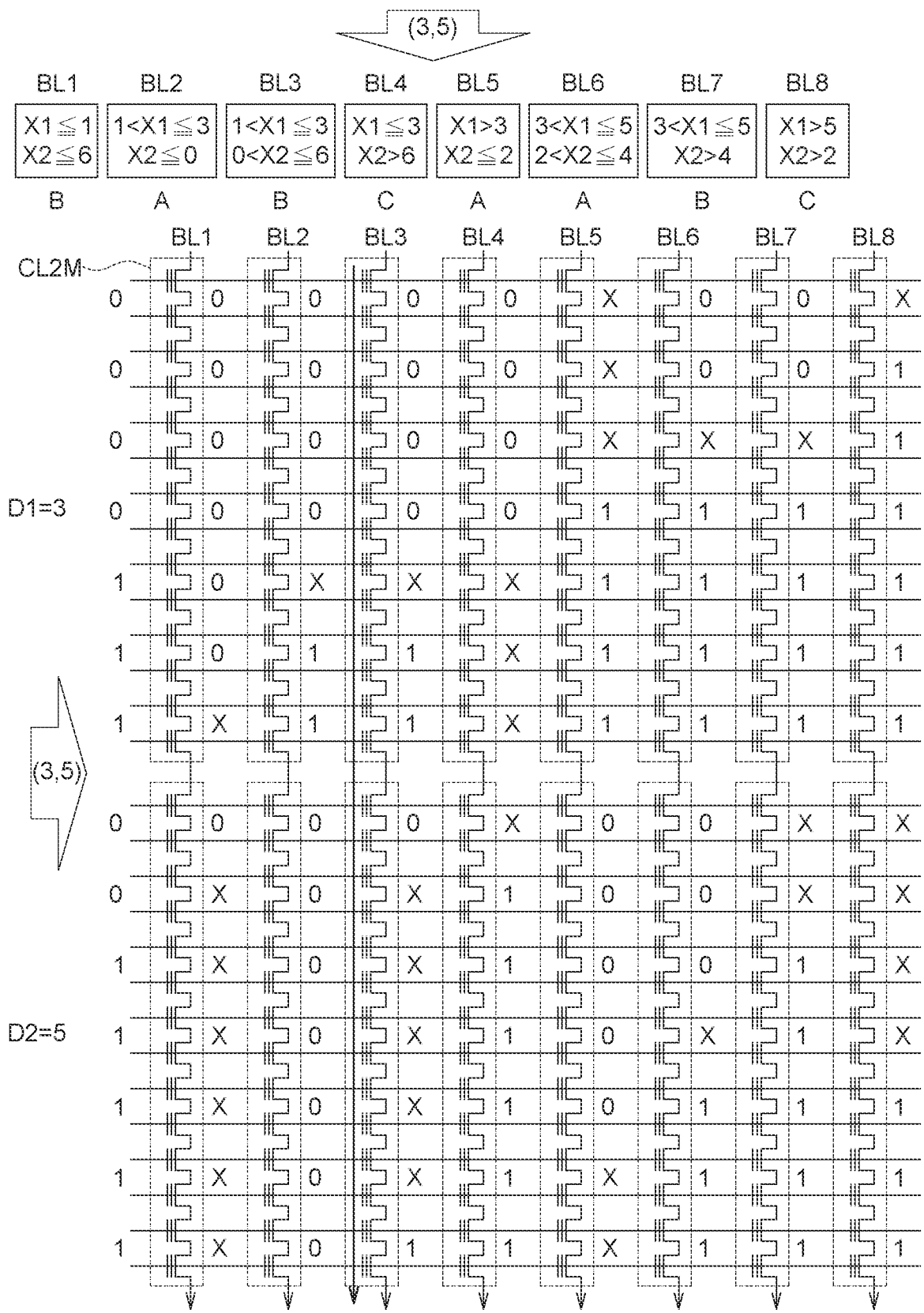
Figure 10C:
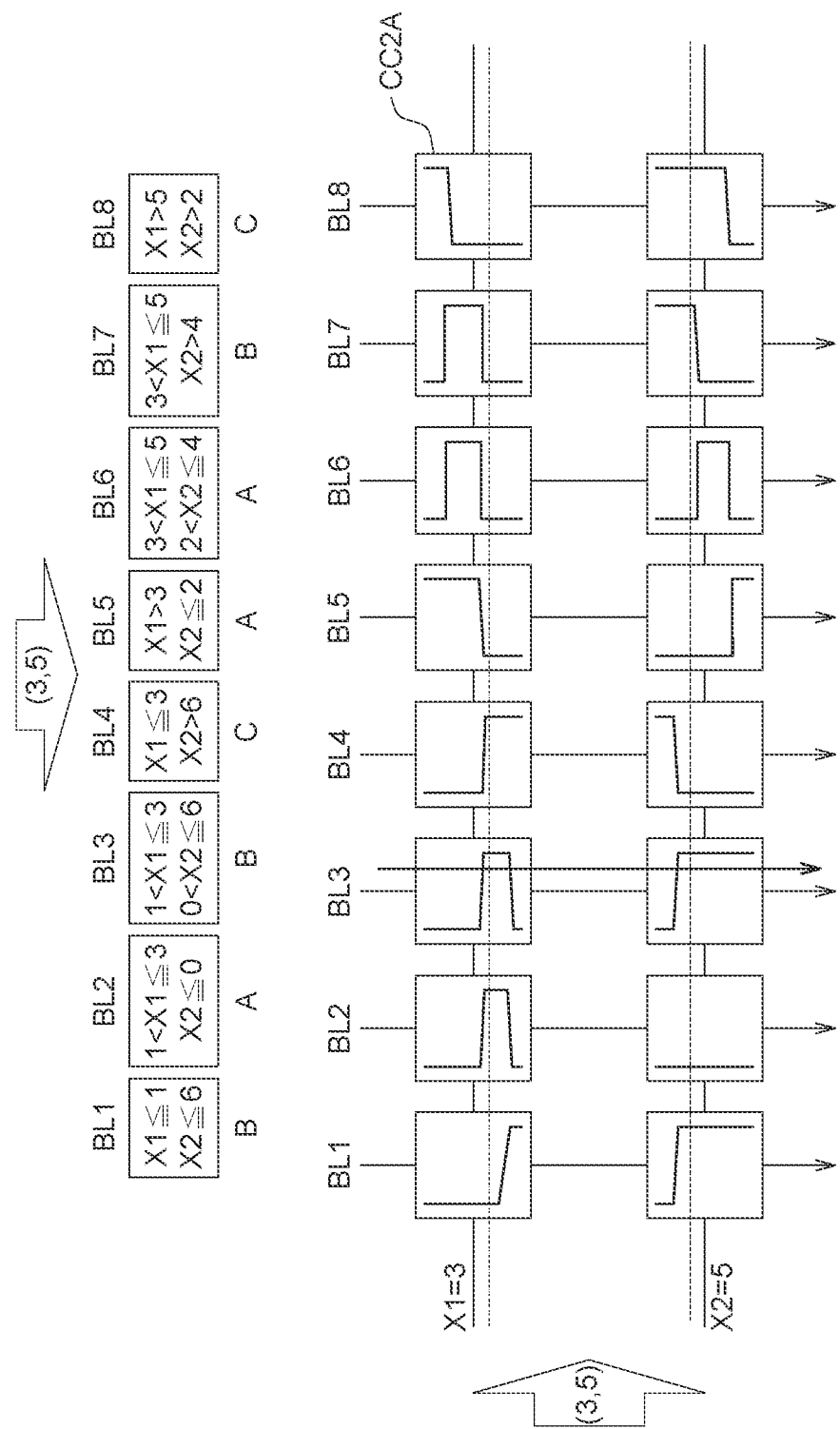

FIG. 10B and FIG. 10C shows tree search implemented by the CAM memory according to one embodiment of the application.

In FIG. 10B, the CAM memory cells CL2 are the multi-level CAM cells CL2M. In comparing the input signal X1=3, the first CAM memory cells on the bit lines BL2~BL4 are matched while the first CAM memory cells on the bit lines BL1 and BL5~BL8 are not matched. In comparing the input signal X2=5, the second CAM memory cells on the bit lines BL1, BL3 and BL7 are matched while the second CAM memory cells on the bit lines BL2, BL4~BL6 and BL8 are not matched. Thus, in FIG. 10B, the sensing current is generated on the bit line BL3 while no sensing current is generated on the bit lines BL1~BL2 and BL4~BL8.

In FIG. 10C, the CAM memory cells CL2 are the analog CAM cells CL2A. In comparing the input signal X1=3, the first CAM memory cells on the bit lines BL2~BL4 are matched while the first CAM memory cells on the bit lines BL1 and BL5~BL8 are not matched. In comparing the input signal X2=5, the second CAM memory cells on the bit lines BL1, BL3 and BL7 are matched while the second CAM memory cells on the bit lines BL2, BL4~BL6 and BL8 are not matched. Thus, in FIG. 10C, the sensing current is generated on the bit line BL3 while no sensing current is generated on the bit lines BL1~BL2 and BL4~BL8.

When the input signal has long information, a plurality of blocks of the CAM array are used in content storage and data comparison in the embodiment of the application. The search results of different blocks are combined (for example, "logic AND") to generate the search result.

Figure 11A:
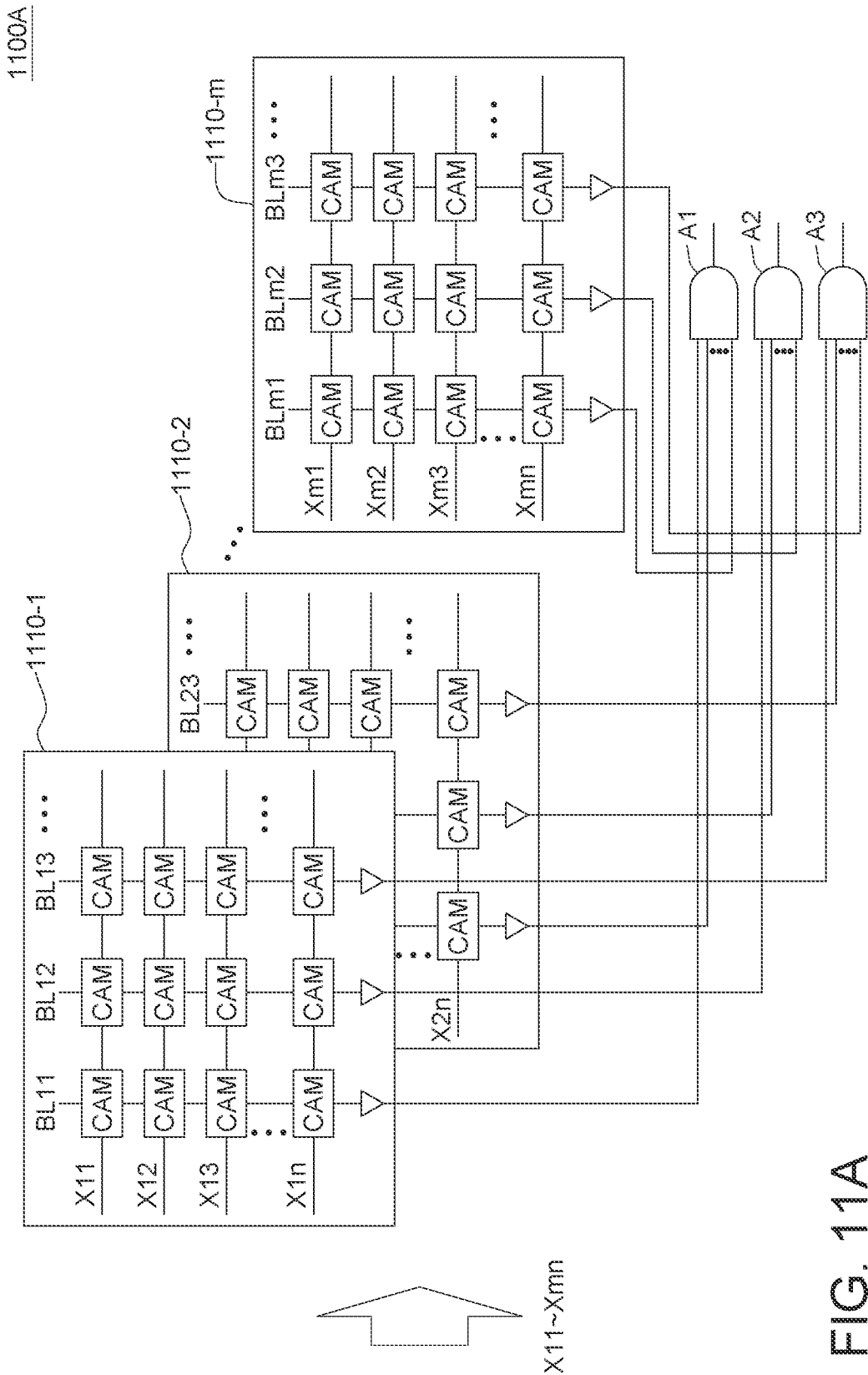
FIG. 11A and FIG. 11B show two structures in searching long input signal according to one embodiment of the application.
Figure 11B:
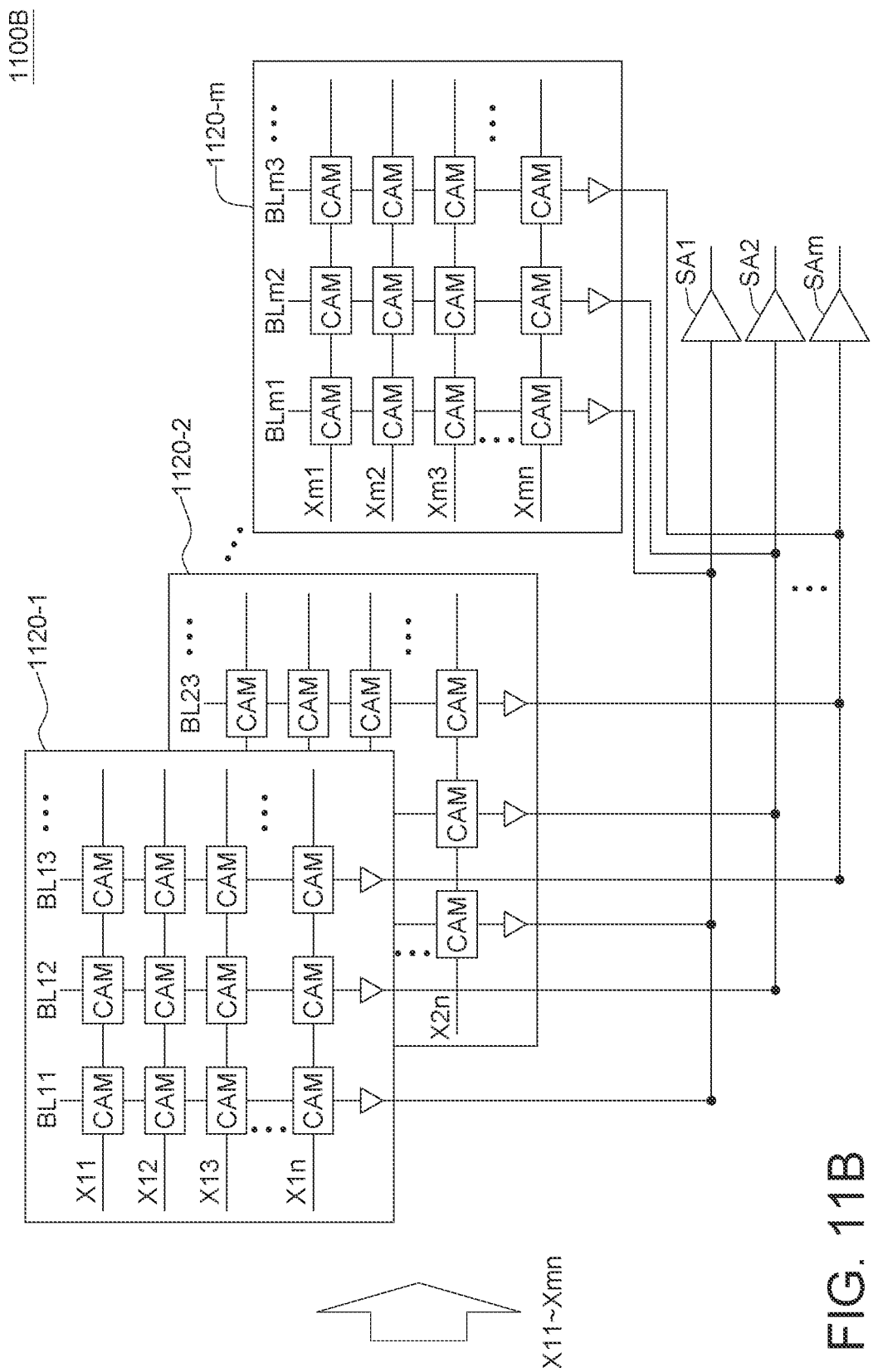

FIG. 11A and FIG. 11B show two structures in searching long input signal according to one embodiment of the application.

In FIG. 11A, the CAM memory 1100A includes a plurality of blocks 1110-1~1110-$m$, and each of the blocks 1110-1~1110-$m$ may have structure as shown in FIG. 8A. Details of the blocks 1110-1~1110-$m$ are omitted here.

In data search, the input signals X11~X1$n$, X21~X2$n$, ..., Xm1~Xmn are respectively input into the blocks 1110-1~1110-$m$ for content comparison. The comparison results of the blocks 1110-1~1110-$m$ are input into the logic gates A1~Am via the bit lines BL11~BLmn. Based on whether the logic gates A1~Am output the sensing current, the match result is determined. For example, if the logic gate outputs the sensing current, the data comparison result is matched.

In FIG. 11B, the CAM memory 1100B includes a plurality of blocks 1120-1~1120-$m$, and each of the blocks 1120-1~1120-$m$ may have structure as shown in FIG. 8A. Details of the blocks 1120-1~1120-$m$ are omitted here.

In data search, the input signals X11~X1$n$, X21~X2$n$, . . . X$m$1~X$mn$ are respectively input into the blocks 1120-1~1120-$m$ for content comparison. The comparison results of the blocks 1120-1-1120-$m$ are input into the sensing amplifiers SA1~SA$m$ via the bit lines BL11~BL$mn$. Based on whether the sensing currents output from the sensing amplifiers SA1~SA$m$ are higher than a reference sensing current, the match result is determined. For example, if the sensing amplifier outputs the sensing current higher than the reference sensing current, the data comparison result is matched.

The second embodiment of the application may be applied in machine learning, for example but not limited by, decision tree, KD search tree, random forest, Support Vector Machine (SVM) and so on. The second embodiment of the application may be also applied in neutral network for searching classification. The second embodiment of the application may be also applied in database application for searching similar data.

The second embodiment of the application may have fast search speed and compare high data for improving data search speed and performance.

Figure 12:
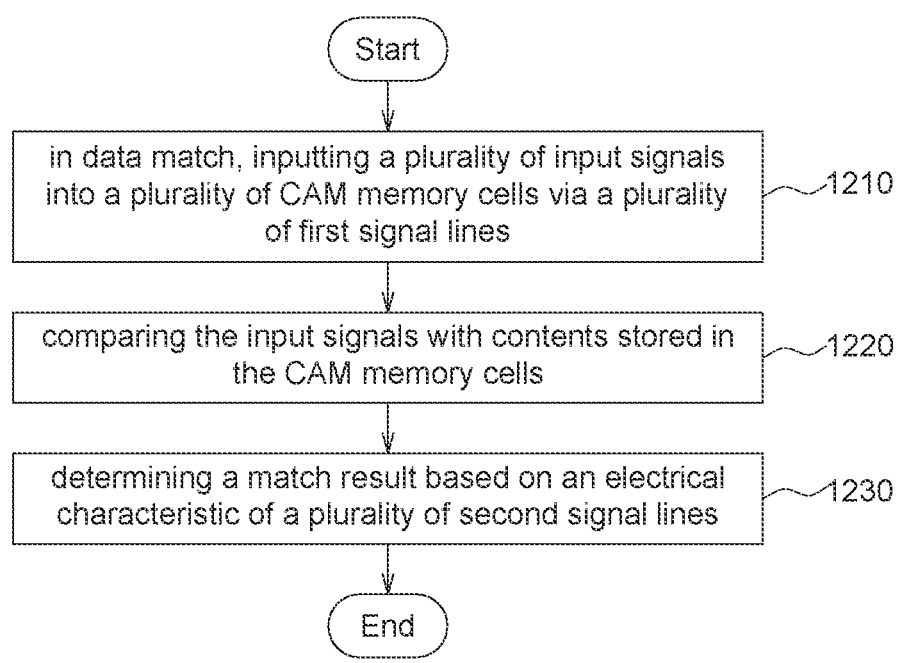
FIG. 12 shows an operation method for the CAM memory according to one embodiment of the application.

FIG. 12 shows an operation method for the CAM memory according to one embodiment of the application. The operation method for the CAM memory include: in step 1210, in data match, inputting a plurality of input signals into a plurality of CAM memory cells via a plurality of first signal lines; in step 1220, comparing the input signals with contents stored in the CAM memory cells; and in step 1230, determining a match result based on an electrical characteristic of a plurality of second signal lines.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A content-address memory (CAM) comprising:
   a plurality of first signal lines;
   a plurality of second signal lines; and
   a plurality of CAM memory cells coupled to the first signal lines and the second signal lines,
   wherein in data match, a plurality of input signals are input into the CAM memory cells via the first signal lines;
   the input signals are compared with contents stored in the CAM memory cells; and
   a match result is determined based on an electrical characteristic of the second signal lines, wherein the electrical characteristic of the second signal lines comprises whether a sensing current is generated on the second signal lines, and wherein the CAM memory cell includes two or more floating-gate devices coupled in parallel or in series, or the CAM memory cell includes two or more super steep slope devices coupled in parallel or in series.

2. The CAM according to claim 1, wherein the match result is determined based on whether respective voltages of the second signal lines are changed or not.

3. The CAM according to claim 1, wherein with respect to the second signal lines, the CAM memory cells are coupled in parallel with each other.

4. The CAM according to claim 1, wherein with respect to the second signal lines, the CAM memory cells are coupled in series with each other.

5. The CAM according to claim 1, wherein
   the CAM memory cell is an analog CAM memory cell, a digital CAM memory cell or a multi-level CAM memory cell; and
   the input signals are analog data, digital data or multi-level data.

6. An operation method for a content-address memory (CAM), the operation method comprising:
   in data match, inputting a plurality of input signals into a plurality of CAM memory cells via a plurality of first signal lines;
   comparing the input signals with contents stored in the CAM memory cells; and
   determining a match result based on an electrical characteristic of a plurality of second signal lines, wherein the electrical characteristic of the second signal lines comprises whether a sensing current is generated on the second signal lines, and wherein the CAM memory cell includes two or more floating-gate devices coupled in parallel or in series, or the CAM memory cell includes two or more super steep slope devices coupled in parallel or in series.

7. The operation method according to claim 6, wherein the match result is determined based on whether respective voltages of the second signal lines are changed or not.

8. The operation method according to claim 6, wherein with respect to the second signal lines, the CAM memory cells are coupled in parallel with each other.

9. The operation method according to claim 6, wherein with respect to the second signal lines, the CAM memory cells are coupled in series with each other.

10. The operation method according to claim 6, wherein
    the CAM memory cell is an analog CAM memory cell, a digital CAM memory cell or a multi-level CAM memory cell; and
    the input signals are analog data, digital data or multi-level data.

* * * * *